United States Patent
Fang et al.

(10) Patent No.: US 10,381,138 B2
(45) Date of Patent: Aug. 13, 2019

(54) RESISTOR, A HEAT DISSIPATER AND A COMBINATORY DEVICE OF RESISTOR AND HEAT DISSIPATER

(71) Applicants: NR ELECTRIC CO., LTD, Jiangsu (CN); NR ENGINEERING CO., LTD, Jiangsu (CN); NR ELECTRIC POWER ELECTRONICS CO., LTD., Jiangsu (CN)

(72) Inventors: Taixun Fang, Jiangsu (CN); Xiang Zhang, Jiangsu (CN); Lei Liu, Jiangsu (CN); Zhao Li, Jiangsu (CN); Guangtai Zhang, Jiangsu (CN); Fengfeng Ding, Jiangsu (CN); Huiliang Zhang, Jiangsu (CN)

(73) Assignees: NR ELECTRIC CO., LTD, Jiangsu (CN); NR ENGINEERING CO., LTD, Jiangsu (CN); NR ELECTRIC POWER ELECTRONICS CO., LTD., Jiangsu (CN)

( * ) Notice: Subject to any disclaimer, the term of this patent is extended or adjusted under 35 U.S.C. 154(b) by 303 days.

(21) Appl. No.: 15/505,915

(22) PCT Filed: Sep. 29, 2015

(86) PCT No.: PCT/CN2015/091026
§ 371 (c)(1),
(2) Date: Feb. 22, 2017

(87) PCT Pub. No.: WO2016/026470
PCT Pub. Date: Feb. 25, 2016

(65) Prior Publication Data
US 2017/0278599 A1    Sep. 28, 2017

(30) Foreign Application Priority Data

Aug. 22, 2014  (CN) .......................... 2014 1 0419992

(51) Int. Cl.
*F28D 15/00*    (2006.01)
*H01C 1/08*    (2006.01)
(Continued)

(52) U.S. Cl.
CPC .................. *H01C 1/08* (2013.01); *H01C 1/01* (2013.01); *H01C 1/028* (2013.01); *H01C 1/082* (2013.01);
(Continued)

(58) Field of Classification Search
CPC ... H01C 3/20; H01C 1/08; H01C 1/01; H01C 1/028; H01C 1/082; H01C 1/12;
(Continued)

(56) References Cited

U.S. PATENT DOCUMENTS

| 3,742,422 A | 6/1973 | Rozema et al. |
| 4,182,928 A | 1/1980 | Murphy et al. |

(Continued)

FOREIGN PATENT DOCUMENTS

| CN | 2520557 | 11/2002 |
| CN | 202307384 | 7/2012 |

(Continued)

OTHER PUBLICATIONS

"International Search Report (Form PCT/ISA/210)", dated Jan. 5, 2016, with English translation thereof, pp. 1-4.

*Primary Examiner* — Davis D Hwu
(74) *Attorney, Agent, or Firm* — JCIPRNET

(57) ABSTRACT

Disclosed are a resistor, a heat dissipater and a combinatory device of the resistor and the heat dissipater, and relates to the field of power electronics. The resistor is cylindrical, and comprises a metal end, an insulating part, a casing, metal bars, a resistor wire, thermally conductive insulating fillers and a metal connection mechanism. The metal connection mechanism of the resistor and the heat dissipater are con- (Continued)

nected by means of direct contact. The structure and the connection method can shorten the length of the resistor, completely insulate the electrical circuits of the resistor from the possible leakage of the water inlet- and outlet-pipe of the heat dissipater, and enable the combinatory device of the resistor and the heat dissipater to be structurally more compact and the connections thereof cleaner.

18 Claims, 3 Drawing Sheets

(51) Int. Cl.
*H01C 1/028* (2006.01)
*H01C 1/082* (2006.01)
*H01C 1/14* (2006.01)
*H01C 3/00* (2006.01)
*H01C 1/01* (2006.01)
*H01C 1/12* (2006.01)
*H01L 23/46* (2006.01)

(52) U.S. Cl.
CPC ............... *H01C 1/12* (2013.01); *H01C 1/14* (2013.01); *H01C 3/00* (2013.01); *H01L 23/46* (2013.01)

(58) Field of Classification Search
CPC .. H01C 1/14; H01C 3/00; H01L 23/46; F01K 25/14
USPC ..................................................... 165/104.33
See application file for complete search history.

(56) References Cited

U.S. PATENT DOCUMENTS 6,601,390 B1* 8/2003 Yazawa ................. F01K 25/14
60/650
9,978,483 B2* 5/2018 Lee .......................... H01C 3/20

FOREIGN PATENT DOCUMENTS

CN  104183341  12/2014
CN  204102650  1/2015

* cited by examiner

RESISTOR, A HEAT DISSIPATER AND A COMBINATORY DEVICE OF RESISTOR AND HEAT DISSIPATER

CROSS-REFERENCE TO RELATED APPLICATION

This application is a 371 application of International PCT application serial no. PCT/CN2015/091026, filed on Sep. 29, 2015, which claims the priority benefit of Chinese application no. 201410419992.1, filed on Aug. 22, 2014. The entirety of each of the abovementioned patent applications is hereby incorporated by reference herein and made a part of this specification.

TECHNICAL FIELD

The present invention relates to a technical field of power electronics and power system, in particular relates to a resistor, a heat dissipater and a combinatory device of the resistor and the heat dissipater.

BACKGROUND

With the maturity of high-power power electronics technology and the demands on power system development, using high-voltage high-power resistors is necessary in more and more scenes.

Presently high-power resistors applied in domestic and abroad suffer very high power dissipation in operation of resistors, thus radiating methods to resistors must be designed. Presently there are two kinds of common radiating methods. The first method is cooling resistor wires by immersing resistor wires in cooling fluid directly.

The disadvantages thereof are vulnerably occurring chemical reactions, such like ionization and rustiness, in case resistors are under current for a long-time running, which affects the reliability of resistors and circulating cooling circuits enormously. The second method as shown in FIG. 1: reference sign 1 in drawings represents a heat dissipater, and reference signs 2, 3 represent respectively an inlet and outlet. Heat of the resistor is transferred to the metal heat dissipater via heat transfer medium, and then fluid cooling proceeds via the heat dissipater. The disadvantages thereof are that, when the resistor is mounted in the heat dissipater, an electrical tail wire 20 on one side of the resistor and an inlet- and outlet-pipe 21 will affect each other mutually. Meanwhile when for the inlet- and outlet-pipe 21 occurs weeping or other malfunctions, it may cause electrical damages, which reduces the reliability of the system enormously; moreover the one end of the resistor closing to the inlet- and outlet-pipe 21 of the heat dissipater can stretch out of the heat dissipater for a relatively long distance, which causes incompact structure and space waste of the combinatory device of the resistor and the heat dissipater; in occasions where resistors and heat dissipaters are applied frequently, the electrical tail wires closing to the one end of the inlet- and outlet-pipe of the heat dissipater make the wiring irregular.

SUMMARY OF THE INVENTION

The objective of the present invention is to provide a resistor, a heat dissipater and a combinatory device of the resistor and the heat dissipater, in order to accomplish a complete isolation between an electrical circuit and a cooling branch circuit of the resistor, a compact structure of the combinatory device of the resistor and the heat dissipater, and a concise electrical connection of the resistor.

To achieve the objective above, the technical solutions of the present invention are:

A resistor, which is cylindrical, and comprises a metal end 10, an insulating part 11, a casing 12, a first metal bar 15a, a second metal bar 15b, a resistor wire 13, thermally conductive insulating fillers 14, a metal connection mechanism 18, the relationships of the parts are as below: a cavity of the casing 12 in which the resistor wire 13 is placed, and is filled with the thermally conductive insulating fillers 14; both ends of the resistor wire 13 are connected respectively to the first metal bar 15a and the second metal bar 15b which stretch into the casing 12; the other end of the second metal bar 15b is connected to the metal end 10 as one head end of the resistor, the other end of the first metal bar 15a is reliably connected to the metal connection mechanism 18 as the other head end of the resistor, the metal connection mechanism 18 is connected to an one end of the casing (12) with equal electric potentials; spaces between the inner diameter of one end of the casing 12 and the second metal bar 15b exposing out of the casing 12 and the metal end 10 are sealed with insulating material 11. The metal connection mechanism 18 comprises a metal end cap 16 and a metal mounting ring 17, the metal end cap 16 is connected with one end of the casing 12. The metal connection mechanism 18 comprises a metal end cap 16 and a thread 19 on the outer diameter of the end cap, the metal end cap 16 is connected with one end of the casing 12.

The other end of the second metal bar 15b is electrically connected with the metal end 10 by welding.

The metal end 10 is provided with a thread structure used for connecting with a tail wire. The metal connection mechanism 18 is electrically connected to the first metal bar 15a by one of the following methods:

welding or matched thread screwing.

The space between the inner diameter of one end of the casing 12 which is connected to the metal connection mechanism 18 and the first metal bar 15a exposing out of the casing 12 is filled with the insulating materials.

The metal end cap 16 is electrically connected to the metal mounting ring 17 by one of the following methods:

welding, thermal shrinkage locking or matched thread screwing.

A heat dissipater which comprises an inlet- and outlet and at least a resistor hub, wherein the resistor hub is provided with a fixing mechanism, which is matched to the metal connection mechanism 18 of the resistor, the fixing mechanism is matched to the metal connection mechanism 18 so as to accomplish the mechanical fixation of the resistor on the heat dissipater and the electrical connection between the resistor and the heat dissipater. The fixing mechanism comprises screw holes and threads which are matched to metal screws of the metal mounting ring 17 of the resistor.

The fixing mechanism comprises screw holes and threads which are matched to a thread 19 on the outer diameter of the end cap of the resistor.

The device comprises the resistor of any one of claims 1-8 and the heat dissipater of any one of claims 9-11, wherein in each heat dissipater at least one resistor is mounted, and the resistor is mechanically fixed on the heat dissipater by metal connection mechanism 18 to accomplish the electrical connection.

By applying the technical solutions above, the present invention can at least achieve the following advantageous effects: 1) shortening the length of the resistor under conditions of constant resistance and sectional area;

2) completely insulate the electrical circuits from the cooling branch circuit, to avoid electrical malfunctions caused by leakage of the inlet- and outlet-pipe of the heat dissipater;

3) enable the combinatory device of the resistor and the heat dissipater to be structurally more compact, and saving space;

4) needless of a terminal electrical lead-out wire closing to one end of the inlet- and outlet-pipe of the heat dissipater, so as to make electrical connection cleaner.

DETAILED DESCRIPTION OF THE INVENTION

The technical solution of the present invention is further explained as below with reference to the accompanying drawings and detailed description.

Figure 1:
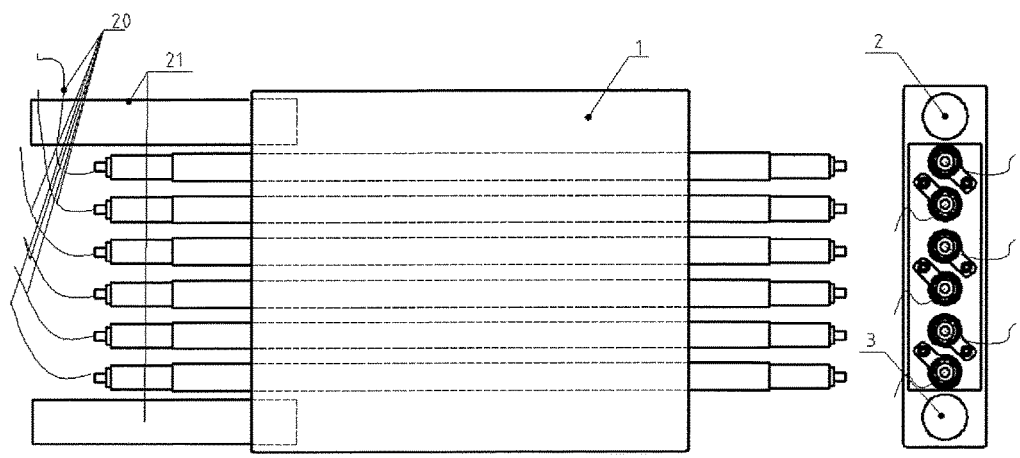
FIG. 1 shows a structure schematic diagram of a combinatory device of a resistor and a heat dissipater of the prior art.
Figure 2:
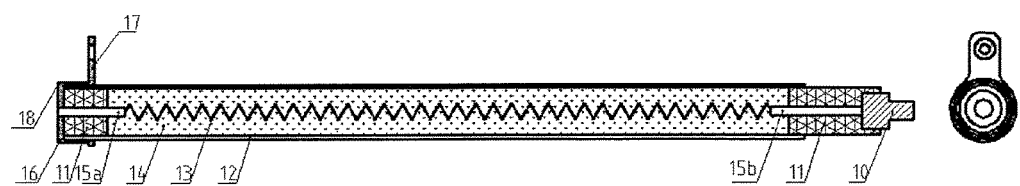
FIG. 2 shows a structure scheme of an embodiment of a single resistor of the present invention.

A structure scheme of an embodiment of a single resistor of the present invention is shown as in FIG. 2, wherein the resister comprises a metal end 10, an insulating part 11, a casing 12, a first metal bar 15a and a second metal bar 15b, a resistor wire 13, thermally conductive insulating fillers 14 and a metal connection mechanism 18. The casing 12 is normally made of metal materials, a cavity thereof where the resistor wire 13 is placed, and is filled with thermally conductive insulating fillers 14; both ends of the resistor wire 13 are connected respectively with one end of the first metal bar 15a stretching into the casing 12 and one end of the second metal bar 15b. The other end of the second metal bar 15b is connected with the metal end 10 as a head end of the resistor. A portion of the second metal bar 15b is exposing out of the casing 12; the other end of the first metal bar 15a is reliably connected with the metal connection mechanism 18 as the other head end of the resistor; meanwhile the metal connection mechanism 18 is connected with one end of the casing 12 (seamless connection could be achieved) with equal electric potentials; spaces between the inner diameter of one end of the casing 12 and the second metal bar 15b exposing out of the casing 12 and the metal end 10 are sealed with the filling insulating materials 11; the insulating part 11 is normally manufactured epoxy casting, to accomplish electrical isolation of the second metal bar 15b from the casing 12.

In the above-mentioned embodiment, the electrical connection between the other end of the second metal bar 15b and the metal end 10 can be accomplished by means of welding.

In the above-mentioned embodiment, the metal end 10 can comprise thread structure, to facilitate connecting with the lead-out wire. In the above-mentioned embodiment, an electrical connection between the metal connection mechanism 18 and the first metal bar 15a can be accomplished by one of the following means: welding or matched thread screwing.

In the above-mentioned embodiment, the space between the inner diameter of one end connected to the metal connection mechanism 18 of the casing 12 and the first metal bar 15a exposing out of the casing 12 are filled with insulating materials, as shown in FIG. 2 that the insulating part 11 between the inner diameter of one end of the casing 12 connected to the metal connection mechanism 18 and the first metal bar 15a exposing out of the casing 12; the insulating part 11 is normally manufactured by epoxy casting, to accomplish electrical isolation between the first metal bar 15a and the casing 12.

In the above-mentioned embodiment, the metal connection mechanism 18 can be any one of structures achieving direct contact and connection between one end of the resistor and the heat dissipater.

Figure 3:
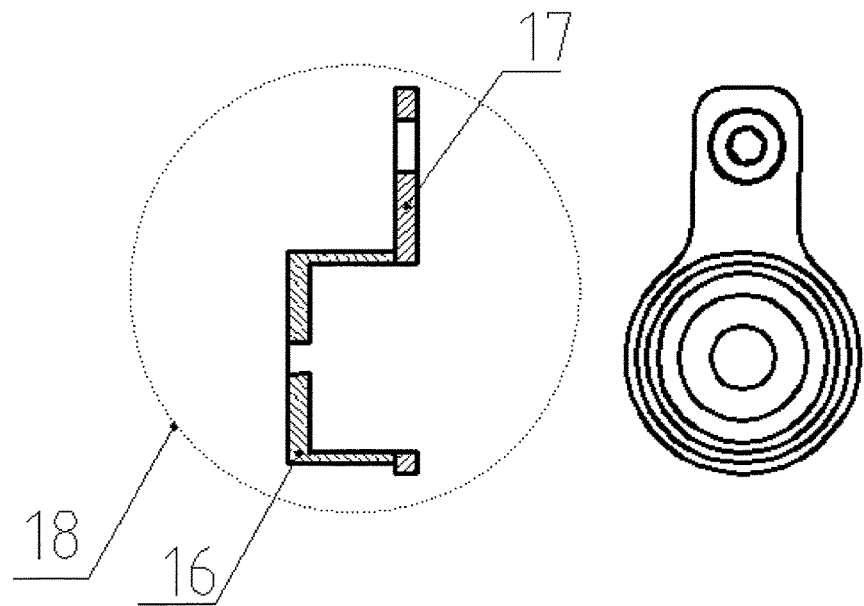
FIG. 3 shows a structure scheme of an embodiment of a terminal metal connection mechanism of the present invention.

FIG. 3 shows a structure scheme of an embodiment of the terminal metal connection mechanism. The metal connection mechanism 18 is consist of a metal end cap 16 and a metal mounting ring 17. The electrical connection between the metal end cap 16 and the metal mounting ring 17 can be accomplished by means of welding, thermal shrinkage locking, matched thread screwing and so on. The metal end cap 16 is connected with one end of the casing 12 (seamless connection could be achieved). It should be noted that the insulating part 11 between the metal connection mechanism 18 and the thermally conductive insulating fillers 14 (between the inner diameter of one end connected to the metal connection mechanism 18 of the casing 12 and the first metal bar 15a stretching out of the casing 12) is added for facilitating the manufacture of a resistor, and is not essential for the electrical functions of the resistor of the present invention.

Figure 4:
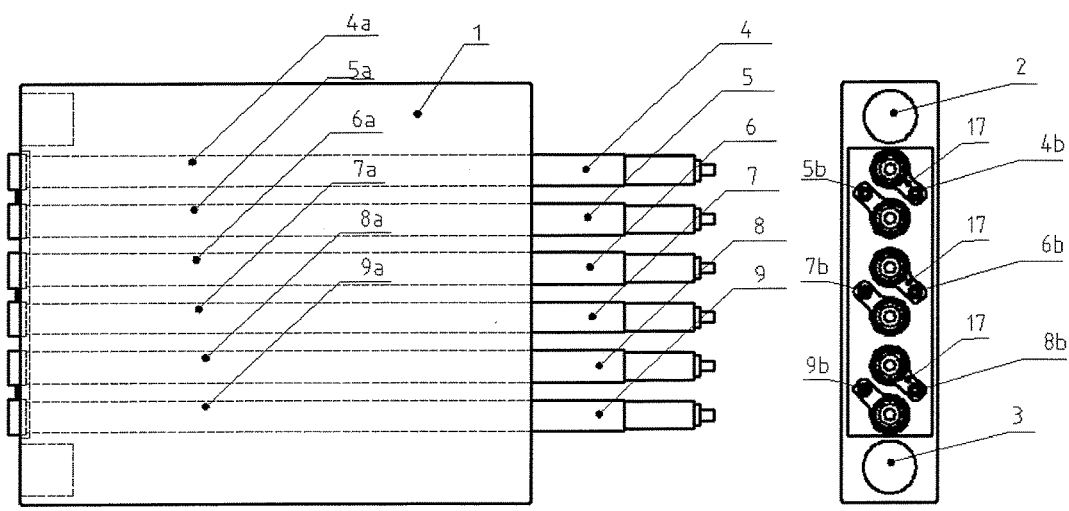
FIG. 4 shows a structure scheme of an embodiment of a combinatory device of a resistor and a heat dissipater of the present invention.

FIG. 4 is a structure scheme of an embodiment for a combinatory device of a resistor and a heat dissipater of the present invention, wherein the heat dissipater 1 comprises an inlet- and outlet (as respectively shown with reference signs 2, 3 in the figure) and at least one resistor hub (there are 6 in the figure, as shown with reference signs 4a-9a in the figure); there are 6 resistors (4-9) in total, employing the structure shown in FIG. 2, and mounted in the heat dissipater 1. According to practical applications, at least one such resistor can be mounted in the heat dissipater 1. The resistor hub is provided with a fixing mechanism, which is matched to the metal connection mechanism 18 of the resistor, matching the fixing mechanism with the metal connection mechanism 18 could accomplish the mechanical fixation of the resistor on the heat dissipater and the electrical connection between the resistor and the heat dissipater. As seen from the right side view that the mounting ring 17 of the resistor is fixed on the heat dissipater (the fixing mechanism of the heat dissipater comprises screw holes and threads matched to the metal screws of the metal mounting ring 17 of the resistor) via metal screws (4b-9b). On one hand, it accomplishes the mechanical fixation between the heat dissipater and the resistor. On the other hand, it accomplishes the electrical reliable connection between the heat dissipater and one end of the resistor, so that one end of the resistor and the heat dissipater have equal potentials, and current flowing in the heat dissipater is conducted into one end of the resistor directly. As seen from the front view that after mounting of the resistor in the heat dissipater, there is no any electrical lead-out wire around one end of the inlet- and outlet-pipe of the heat dissipater, so as to avoid the mutual affection of the inlet- and outlet-pipe and the electrical connection wires of the resistor. If proper mechanical processing is made with respect to the ends of the resistor hubs of the heat dissipater 1, e.g. milling corresponding notches on the ends of the resistor hubs of the heat dissipater 1 according to the shape and the thickness of the metal connection mechanism 18 of the resistor, then the metal connection mechanism 18 of the resistor could be embed in the heat dissipater 1 completely while mounting, so as to make the surface of the metal connection mechanism 18 of the resistor flush to a side surface of the heat dissipater, or only to leave "little bulges" on the side surface of the heat dissipater with a same number as the number of the plugged resistors. It brings better effects in view of electric and esthetics.

It should be noted that in the practical applications, the number of the resistor hubs comprised in a heat dissipater is not limited to the same mentioned in the above embodiments, but can be varied depending on actual practice.

Figure 5:
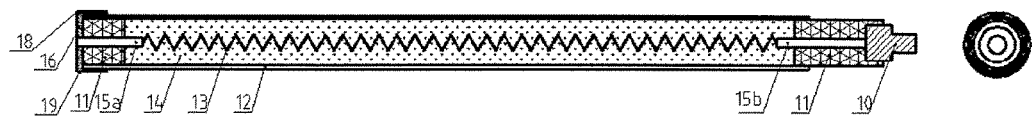
FIG. 5 shows a structure scheme of another embodiment of a single resistor.

FIG. 5 shows a structure scheme of another embodiment of a single resistor of the present invention, wherein the resistor comprises a metal end 10, an insulating part 11, a casing 12, a first metal bar 15*a* and a second metal bar 15*b*, a resistor wire 13, thermally conductive insulating fillers 14, and a metal connection mechanism 18. The casing 12 is normally made of metal materials, a cavity thereof where the resistor wire 13 is placed, and is filled with thermally conductive insulating fillers 14; both ends of the resistor wire 13 are connected respectively with one end of the first metal bar 15*a* stretching into the casing 12 and with one end of the second metal bar 15*b*. The other end of the second metal bar 15*b* is connected with the metal end 10 as one end of the resistor. A portion of second metal bar 15*b* is exposing out of the casing 12. The other end of the first metal bar 15*a* is reliably connected with the metal connection mechanism 18 as the other end of the resistor. Meanwhile the metal connection mechanism 18 is connected with one end of the casing 12 (seamless connection could be achieved) with equal electric potentials; spaces between the inner diameter of one end of the casing 12 and the second metal bar 15*b* exposing out of the casing 12 and the metal end 10 are sealed with the filling insulating material 11; the insulating part 11 is normally manufactured by epoxy casting, to accomplish electrical isolation.

In the above-mentioned embodiment, electrical connection of the other end of the second metal bar 15*b* and the metal end 10 can be accomplished by means of welding.

In the above-mentioned embodiment, the metal end 10 can comprise a thread structure, to facilitate connecting with the lead-out wire. In the above-mentioned embodiment, an electrical connection between the metal connection mechanism 18 and the first metal bar 15*a* can be accomplished by one of the following means: welding or matched thread screwing.

In the above-mentioned embodiment, a space between the inner diameter of one end connected to the metal connection mechanism 18 of the casing 12 the first metal bar 15*a* exposing out of the casing 12 is filled with insulating materials, as the insulating part 11 between the inner diameter of one end connected to the metal connection mechanism 18 of the casing 12 and the first metal bar 15*a* exposing out of the casing 12 shown in FIG. 5; the insulating part 11 is normally manufactured by epoxy casting, to accomplish the electrical isolation between the first metal bar 15*a* and the casing 12.

In the above-mentioned embodiment, the metal connection mechanism 18 comprises the metal end cap 16 and the thread 19 on the outer surface of the end cap. The end cap 16 is connected with the one end of the casing 12 (seamless connection possible). The resistor is mounted in the heat dissipater via the thread 19 directly, meantime the electrical reliable connection of the one end of the resistor and the heat dissipater is accomplished.

Figure 6:
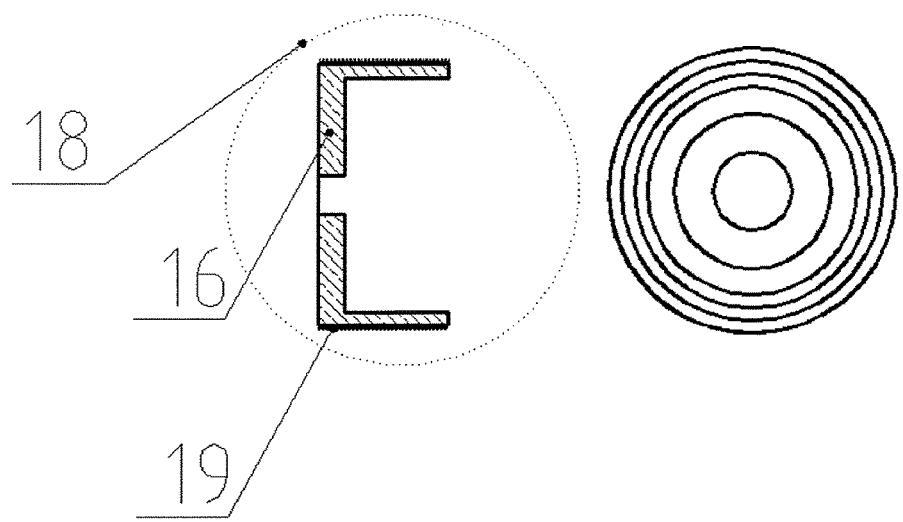
FIG. 6 shows a structure scheme of another embodiment of a teii iinal metal connection mechanism of the present invention.
Figure 7:
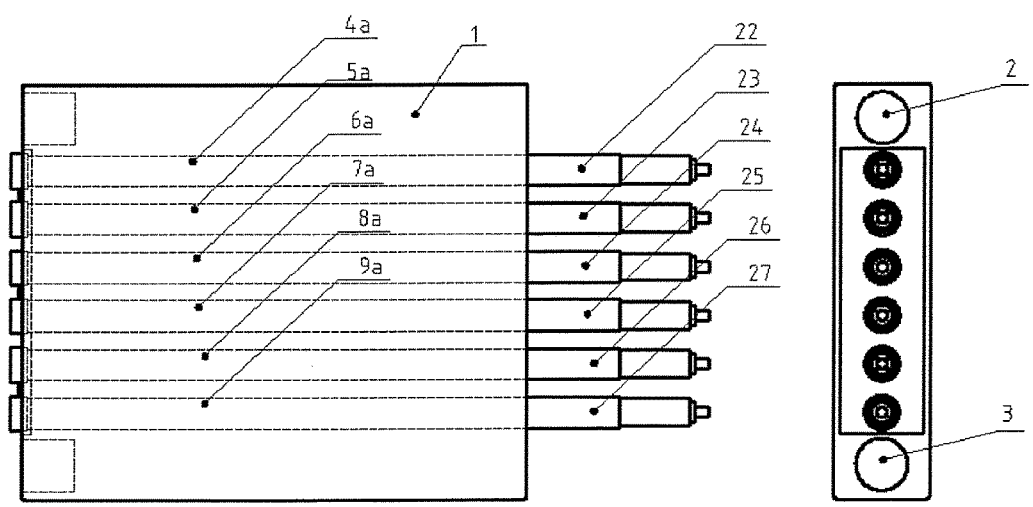
FIG. 7 shows a structure scheme of an embodiment of a combinatory device of a resistor and a heat dissipater.

FIG. 6 shows a structure scheme of another embodiment of the metal connection mechanism at the end of the present invention, the metal connection mechanism 18 comprises the metal end cap 16 and the thread 19 and is mounted in the heat dissipater directly by the thread 19. There are 6 such resistor (22-27) mounted in the heat dissipater as shown in FIG. 7. FIG. 7 is a structure scheme of an embodiment for a combinatory device of resistors and heat dissipaters of the present invention, wherein a heat dissipater 1 comprises inlet- and outlet (as respectively shown with reference signs 2, 3 in the figure.) and at least one resistor hub (there are 6 in the fig., as shown in the fig. with reference signs 4*a*-9*a*); there are 6 resistors (22-27) in total, applying the structure as shown in FIG. 5, and mounted in the heat dissipater 1. According to practical applications in the heat dissipater 1 at least one such resistor can be mounted. The resistor hub is provided with a fixing mechanism, which is matched to the metal connection mechanism 18 of the resistor, matching the fixing mechanism and the metal connection mechanism 18 could accomplish the mechanical fixation of the resistor on the heat dissipater and the electrical connection between the resistor and the heat dissipater. As seen from the right side view that the metal connection mechanism 18 of the resistor is fixed on the heat dissipater (the fixing mechanism of the heat dissipater comprises screw holes and threads matched to the threads 19 on the outer surface of the end cap of the resistor) via the thread. On one hand it accomplishes the mechanical fixation between the heat dissipater and the resistor. On the other hand, it accomplishes the electrical reliable connection between the heat dissipater and one end of the resistor, so that one end of the resistor and the heat dissipater have the equal potentials, and the current flowing in the heat dissipater conducted into one end of the resistor directly. As seen from the front view that after mounting of the resistor in the heat dissipater there is no any electrical lead-out wire around one end side of the inlet- and outlet- pipe of the heat dissipater, so as to avoid the mutual affection of the inlet- and outlet-pipe and the electrical connection wires of the resistor. If proper mechanical processing is made with respect to the ends of the resistor hubs of the heat dissipater 1, e.g. milling corresponding notches on the ends of the resistor hubs of the heat dissipater 1 according to the shape and the thickness of the metal connection mechanism 18 of the resistor, then the metal connection mechanism 18 of the resistor could be embed in the heat dissipater 1 completely while mounting, so as to make the surface of the metal connection mechanism 18 of the resistor flush to a side surface of the heat dissipater, or only to leave "little bulges" on the side surface of the heat dissipater with a same number as the number of the plugged resistors. It brings better effects in view of electric and esthetics.

It should be noted that in the practical applications, the number of the resistor hubs comprised in a heat dissipater is not limited to the same mentioned in the above embodiments, but can be varied depending on actual practice.

Summarized by applying the technical solutions above of the present invention, at least the following advantageous effects can be accomplished:

1) shortening the length of the resistor under condition of constant resistance and sectional area;

2) completely insulating the electrical circuits from the cooling branch circuit, to avoid electrical malfunctions caused by leakage of the inlet- and outlet-pipe of the heat dissipater; 3) enable the combinatory device of the resistor and the heat dissipater to be structurally more compact, and saving space;

4) needless of electrical lead-out wires closing to the end of the inlet- and outlet-pipe of the heat dissipater, so as to make electrical connection cleaner.

The above-mentioned embodiments are only used for explaining the technical concept of the present invention, but not wherewith for limiting the protection scope of the present invention. All of the technical concepts according to the present invention, or any amendments or improvements based on the technical solutions fall within the scope of the protection of the present invention.

What is claimed is:

1. A resistor, wherein which is cylindrical, and comprises a metal end, an insulating part, a casing made of a metal material, a first metal bar, a second metal bar, a resistor wire received inside a cavity defined by the casing, thermally conductive insulating fillers, a metal connection mechanism, the relationships of the parts are as below: the cavity in which the resistor wire is placed is filled with thermally conductive insulating fillers both ends of the resistor wire are connected respectively to one end of the first metal bar and one end of the second metal bar which stretch into the casing; the other end of the second metal bar is connected to the metal end as one head end of the resistor, the other end of the first metal bar is reliably connected to the metal connection mechanism as the other head end of the resistor, the metal connection mechanism is directly connected to an end of the casing with equal electric potentials; a portion of the second metal bar is exposing out of the casing, spaces between an inner diameter of one end of the casing and the portion of the second metal bar and the metal end are sealed with insulating materials, wherein a space between the inner diameter of one end of the casing connected to the metal connection mechanism and the first metal bar exposing out of the casing is filled with insulating materials.

2. The resistor according to claim 1, wherein the metal connection mechanism comprises a metal end cap and a metal mounting ring, and the metal end cap is connected to one end of the casing.

3. The resistor according to claim 1, wherein the metal connection mechanism comprises a metal end cap and a thread on an outer diameter of the end cap, and the metal end cap is connected to one end of the casing.

4. The resistor according to claim 1, wherein the other end of the second metal bar is electrically connected to the metal end by welding.

5. The resistor according to claim 1, wherein the metal end is provided with a thread structure used for connecting to a tail wire.

6. The resistor according to claim 1, wherein the metal connection mechanism is electrically connected to the first metal bar by one of the following means: welding or matched thread screwing.

7. The resistor according to claim 2, wherein the metal end cap is electrically connected to the metal mounting ring by one of the following means: welding, thermal shrinkage locking or matched thread screwing.

8. A heat dissipater, comprising an inlet and outlet and at least a resistor hub, wherein the resistor hub is a cylindrical hub crossing the whole heat dissipater and at a hub hole on an outer surface of the heat dissipater, a resistor embeds in the hub hole and has a thickness corresponding to a size of the hub hoe, the resistor hub is provided with a fixing mechanism which is matched to a metal connection mechanism of the resistor, the metal connection mechanism embeds completely in the hub hole with a surface flushing to a side surface of the heat dissipater, the fixing mechanism is matched to the metal connection mechanism so as to accomplish the mechanical fixation of the resistor on the heat dissipater and the electrical connection between the resistor and the heat dissipater.

9. The heat dissipater according to claim 8, wherein the fixing mechanism comprises screw holes and threads which are matched to metal screws on a metal mounting ring of the resistor.

10. The heat dissipater according to claim 8, wherein the fixing mechanism comprises screw holes and threads which are matched to threads on an outer diameter of an end cap of the resistor.

11. A combinatory device of a resistor and a heat dissipater, wherein the device comprises the resistor of claim 1 and the heat dissipater comprises an inlet and outlet and at least a resistor hub, wherein the resistor hub is a cylindrical hub crossing the whole heat dissipater, and at a hub hole on an outer surface of the heat dissipater, a resistor embeds in the hub hole and has a thickness corresponding to a size of the hub hole, the resistor hub is provided with a fixing mechanism which is matched to a metal connection mechanism of the resistor, the metal connection mechanism embeds completely in the hub hole with a surface flushing to a side surface of the heat dissipater, the fixing mechanism is matched to the metal connection mechanism so as to accomplish the mechanical fixation of the resistor on the heat dissipater and the electrical connection between the resistor and the heat dissipater, wherein in one or more hub holes in each of the heat dissipaters is plugged with the resistor, and the resistor mechanically fixed on the heat dissipater by the metal connection mechanism to accomplish the electrical connection.

12. A combinatory device of a resistor and a heat dissipater, wherein the device comprises the resistor of claim 2 and the heat dissipater comprises an inlet and outlet and at least a resistor hub, wherein the resistor hub is a cylindrical hub crossing the whole heat dissipater, and at a hub hole on an outer surface of the heat dissipater, a resistor embeds in the hub hole and has a thickness corresponding to a size of the hub hole, the resistor hub is provided with a fixing mechanism which is matched to a metal connection mechanism of the resistor, the metal connection mechanism embeds completely in the hub hole with a surface flushing to a side surface of the heat dissipater, the fixing mechanism is matched to the metal connection mechanism so as to accomplish the mechanical fixation of the resistor on the heat dissipater and the electrical connection between the resistor and the heat dissipater, in one or more hub holes in each of the heat dissipaters is plugged with the resistor, and the resistor mechanically fixed on the heat dissipater by the metal connection mechanism to accomplish the electrical connection.

13. A combinatory device of a resistor and a heat dissipater, wherein the device comprises the resistor of claim 3 and the heat dissipater comprises an inlet and outlet and at least a resistor hub, wherein the resistor hub is a cylindrical hub crossing the whole heat dissipater, and at a hub hole on an outer surface of the heat dissipater, a resistor embeds in the hub hole and has a thickness corresponding to a size of the hub hole, the resistor hub is provided with a fixing mechanism which is matched to a metal connection mechanism of the resistor, the metal connection mechanism embeds completely in the hub hole with a surface flushing to a side surface of the heat dissipater, the fixing mechanism is matched to the metal connection mechanism so as to accomplish the mechanical fixation of the resistor on the heat dissipater and the electrical connection between the resistor and the heat dissipater, in one or more hub holes in each of the heat dissipaters is plugged with the resistor, and the resistor mechanically fixed on the heat dissipater by the metal connection mechanism to accomplish the electrical connection.

14. A combinatory device of a resistor and a heat dissipater, wherein the device comprises the resistor of claim 4 and the heat dissipater comprises an inlet and outlet and at least a resistor hub, wherein the resistor hub is a cylindrical hub crossing the whole heat dissipater, and at a hub hole on an outer surface of the heat dissipater, a resistor embeds in the hub hole and has a thickness corresponding to a size of the hub hole, the resistor hub is provided with a fixing mechanism which is matched to a metal connection mechanism of the resistor, the metal connection mechanism embeds completely in the hub hole with a surface flushing to a side surface of the heat dissipater, the fixing mechanism is matched to the metal connection mechanism so as to accomplish the mechanical fixation of the resistor on the heat dissipater and the electrical connection between the resistor and the heat dissipater, in one or more hub holes in each of the heat dissipaters is plugged with the resistor, and the resistor mechanically fixed on the heat dissipater by the metal connection mechanism to accomplish the electrical connection.

15. A combinatory device of a resistor and a heat dissipater, wherein the device comprises the resistor of claim 5 and the heat dissipater comprises an inlet and outlet and at least a resistor hub, wherein the resistor hub is a cylindrical hub crossing the whole heat dissipater, and at a hub hole on an outer surface of the heat dissipater, a resistor embeds in the hub hole and has a thickness corresponding to a size of the hub hole, the resistor hub is provided with a fixing mechanism which is matched to a metal connection mechanism of the resistor, the metal connection mechanism embeds completely in the hub hole with a surface flushing to a side surface of the heat dissipater, the fixing mechanism is matched to the metal connection mechanism so as to accomplish the mechanical fixation of the resistor on the heat dissipater and the electrical connection between the resistor and the heat dissipater, in one or more hub holes in each of the heat dissipaters is plugged with the resistor, and the resistor mechanically fixed on the heat dissipater by the metal connection mechanism to accomplish the electrical connection.

16. A combinatory device of a resistor and a heat dissipater, wherein the device comprises the resistor of claim 6 and the heat dissipater comprises an inlet and outlet and at least a resistor hub, wherein the resistor hub is a cylindrical hub crossing the whole heat dissipater, and at a hub hole on an outer surface of the heat dissipater, a resistor embeds in the hub hole and has a thickness corresponding to a size of the hub hole, the resistor hub is provided with a fixing mechanism which is matched to a metal connection mechanism of the resistor, the metal connection mechanism embeds completely in the hub hole with a surface flushing to a side surface of the heat dissipater, the fixing mechanism is matched to the metal connection mechanism so as to accomplish the mechanical fixation of the resistor on the heat dissipater and the electrical connection between the resistor and the heat dissipater in one or more hub holes in each of the heat dissipaters is plugged with the resistor, and the resistor mechanically fixed on the heat dissipater by the metal connection mechanism to accomplish the electrical connection.

17. A combinatory device of a resistor and a heat dissipater, wherein the device comprises the resistor of claim 7 and the heat dissipater comprises an inlet and outlet and at least a resistor hub, wherein the resistor hub is a cylindrical hub crossing the whole heat dissipater, and at a hub hole on an outer surface of the heat dissipater, a resistor embeds in the hub hole and has a thickness corresponding to a size of the hub hole, the resistor hub is provided with a fixing mechanism which is matched to a metal connection mechanism of the resistor, the metal connection mechanism embeds completely in the hub hole with a surface flushing to a side surface of the heat dissipater, the fixing mechanism is matched to the metal connection mechanism so as to accomplish the mechanical fixation of the resistor on the heat dissipater and the electrical connection between the resistor and the heat dissipater, in one or more hub holes in each of the heat dissipaters is plugged with the resistor, and the resistor mechanically fixed on the heat dissipater by the metal connection mechanism to accomplish the electrical connection.

18. A combinatory device of a resistor and a heat dissipater, wherein the device comprises the heat dissipater of claim 9, and the resistor is cylindrical, and comprises a metal end, an insulating part, a casing made of a metal material, a first metal bar, a second metal bar, a resistor wire received inside a cavity defined by the casing, thermally conductive insulating fillers, a metal connection mechanism, the relationships of the parts are as below: the cavity in which the resistor wire is placed is filled with thermally conductive insulating fillers, both ends of the resistor wire are connected respectively to one end of the first metal bar and one end of the second metal bar which stretch into the casing; the other end of the second metal bar is connected to the metal end as one head end of the resistor, the other end of the first metal bar is reliably connected to the metal connection mechanism as the other head end of the resistor, the metal connection mechanism is directly connected to an end of the casing with equal electric potentials; a portion of the second metal bar is exposing out of the casing, spaces between an inner diameter of one end of the casing and the portion of the second metal bar and the metal end are sealed with insulating materials, a space between the inner diameter of one end of the casing connected to the metal connection mechanism and the first metal bar exposing out of the casing is filled with insulating materials, and wherein the heat dissipater in one or more hub holes in each of the heat dissipaters is plugged with the resistor, and the resistor mechanically fixed on the heat dissipater by the metal connection mechanism to accomplish the electrical connection.

\* \* \* \* \*